United States Patent
Youn et al.

(10) Patent No.: US 10,523,120 B2
(45) Date of Patent: Dec. 31, 2019

(54) SUPPLY MODULATOR FOR POWER AMPLIFIER

(71) Applicant: Samsung Electronics Co., Ltd., Suwon-si, Gyeonggi-do (KR)

(72) Inventors: Yongsik Youn, Cupertino, CA (US); Takahiro Nomiyama, Seoul (KR); Younghwan Choo, Hwaseong-si (KR); Dongsu Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/052,557

(22) Filed: Aug. 1, 2018

(65) Prior Publication Data
US 2019/0074769 A1  Mar. 7, 2019

Related U.S. Application Data

(60) Provisional application No. 62/555,321, filed on Sep. 7, 2017.

(51) Int. Cl.
| | |
|---|---|
| *H02M 3/158* | (2006.01) |
| *H03F 1/02* | (2006.01) |
| *H03F 3/19* | (2006.01) |
| *H03F 3/24* | (2006.01) |
| *H03F 3/68* | (2006.01) |
| *H02M 1/00* | (2006.01) |

(52) U.S. Cl.
CPC ........ *H02M 3/1582* (2013.01); *H03F 1/0227* (2013.01); *H03F 3/19* (2013.01); *H03F 3/245* (2013.01); *H03F 3/68* (2013.01); *H02M 2001/0045* (2013.01); *H03F 2200/102* (2013.01); *H03F 2200/432* (2013.01); *H03F 2200/516* (2013.01)

(58) Field of Classification Search
CPC .................................................... H02M 3/158
See application file for complete search history.

(56) References Cited

U.S. PATENT DOCUMENTS

| | | | |
|---|---|---|---|
| 9,432,946 | B2 | 8/2016 | Yamanouchi |
| 9,525,384 | B2 | 12/2016 | Lee et al. |
| 9,602,057 | B1 | 3/2017 | Youn et al. |
| 9,755,672 | B2 | 9/2017 | Perreault et al. |

(Continued)

*Primary Examiner* — Jue Zhang
*Assistant Examiner* — Trinh Q Dang
(74) *Attorney, Agent, or Firm* — Lewis Roca Rothgerber Christie LLP

(57) ABSTRACT

According to some example embodiments, an apparatus includes a buck-boost converter, a first buck converter connected at an output terminal of the buck-boost converter, a second buck converter connected at the output terminal of the buck-boost converter, a first LA including a first supply voltage input connected to the output terminal of the buck-boost converter, and an output terminal connected to an output terminal of the first buck converter, where the first LA is configured to provide a first modulated supply voltage to a first PA of a first transmitter, and a second LA including a second supply voltage input connected to the output terminal of the buck-boost converter, and an output terminal connected to an output terminal of the second buck converter, where the second LA is configured to provide a second modulated supply voltage to a second PA of a second transmitter.

19 Claims, 15 Drawing Sheets

(56) References Cited

U.S. PATENT DOCUMENTS

| | | |
|---|---|---|
| 9,866,176 B2 | 1/2018 | Khesbak et al. |
| 2014/0139199 A1* | 5/2014 | Khlat .................. H02M 3/1582 |
| | | 323/282 |
| 2017/0005619 A1* | 1/2017 | Khlat .................... H03F 1/0227 |
| 2017/0149240 A1* | 5/2017 | Wu ........................... H02J 1/00 |
| 2018/0123516 A1 | 5/2018 | Kim et al. |

* cited by examiner

FIG. 10B

| MODE | | Num | BLOCKs | | | | | | Switches | | | | OUTPUTs | | | |
|---|---|---|---|---|---|---|---|---|---|---|---|---|---|---|---|---|
| | | | B-B | BUCK1 | BUCK2 | Amp1 | Amp2 | Sbb1 | Sbb2 | Sba2 | Sbk1 | Sbk2 | TXB | TXK | TX1 | TX2 |
| only GSM | GSM | 0 | 1 | 0 | 0 | 0 | 0 | 0 | 0 | 0 | 0 | 0 | GSM0 | X | X | X |
| 1x Tx | APT | 1 | 1 | 0 | 0 | 1 | 0 | 1 | 0 | 0 | 0 | 0 | GSM0 | X | APT1 | X |
| | | 2 | 1 | 0 | 0 | 0 | 1 | 0 | 0 | 1 | 0 | 0 | GSM0 | X | X | APT2 |
| | | 3 | 0 | 1 | 0 | 1 | 0 | 0 | 0 | 0 | 1 | 0 | GSM0 | APT01 | APT1 | X |
| | | 4 | 0 | 0 | 1 | 0 | 1 | 0 | 0 | 0 | 0 | 1 | GSM0 | APT02 | X | APT2 |
| | | 5 | 1 | 1 | 0 | 1 | 0 | 0 | 0 | 0 | 1 | 0 | GSM0 | APT01 | APT1 | X |
| | | 6 | 1 | 0 | 1 | 0 | 1 | 0 | 0 | 0 | 0 | 1 | GSM0 | APT02 | X | APT2 |
| | ET | 7 | 1 | 1 | 0 | 1 | 0 | 0 | 1 | 0 | 0 | 0 | GSM0 | X | ET1 | X |
| | | 8 | 1 | 0 | 1 | 0 | 1 | 0 | 0 | 1 | 0 | 0 | GSM0 | X | X | ET2 |
| 2x TX | APTs | 9 | 1 | 1 | 0 | 1 | 1 | 1 | 1 | 0 | 0 | 0 | GSM0 | APT01 | APT1 | APT2 |
| | | 10 | 1 | 0 | 1 | 1 | 1 | 1 | 0 | 1 | 0 | 0 | GSM0 | APT02 | APT1 | APT2 |
| | APT & ET | 11 | 1 | 1 | 1 | 1 | 0 | 0 | 1 | 0 | 0 | 1 | GSM0 | X | ET1 | APT2 |
| | | 12 | 1 | 1 | 1 | 0 | 1 | 0 | 0 | 1 | 1 | 0 | GSM0 | X | APT1 | ET2 |
| | | 13 | 1 | 1 | 1 | 1 | 1 | 1 | 0 | 0 | 0 | 1 | GSM0 | APT01 | ET1 | APT2 |
| | | 14 | 1 | 1 | 1 | 1 | 1 | 0 | 1 | 0 | 1 | 0 | GSM0 | APT02 | APT1 | ET2 |
| | ETs | 15 | 1 | 1 | 1 | 1 | 1 | 0 | 0 | 0 | 1 | 0 | GSM0 | X | ET1 | ET2 |
| | | 16 | 1 | 1 | 1 | 1 | 1 | 0 | 0 | 0 | 0 | 1 | GSM0 | X | ET1 | ET2 |

0=off, 1=on  0=off, 1=on  BOLD: default setting

SUPPLY MODULATOR FOR POWER AMPLIFIER

CROSS-REFERENCE TO RELATED APPLICATION(S)

The present application claims priority to and the benefit of U.S. Provisional Patent Application Ser. No. 62/555,321, filed Sep. 7, 2017 and entitled "System and Method for Providing a Supply Modulator," the entire content of which is hereby expressly incorporated by reference.

FIELD

One or more aspects of embodiments according to the present invention relate to supply modulators, for example, a system and method relating to a supply modulator for power amplifier.

BACKGROUND

A switched mode power supply (SMPS) provides a regulated DC supply that can deliver more power for a given size, cost, and weight of a power unit and are used in a variety of electronic equipment, including computers and other sensitive equipment requiring stable and efficient power supply. SMPS has high efficiency and converts power using switching devices that are turned on and off at high frequencies, and storage components to supply power when the switching device is in its non-conduction state.

The above information disclosed in this Background section is only for enhancement of understanding of the background of the invention and therefore it may contain information that does not constitute prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a system and method relating to a supply modulator for power amplifier.

According to some example embodiments according to the present disclosure, an apparatus includes a buck-boost converter, a first buck converter connected at an output terminal of the buck-boost converter, a second buck converter connected at the output terminal of the buck-boost converter, a first linear amplifier (LA) including a first supply voltage input connected to the output terminal of the buck-boost converter, and an output terminal connected to an output terminal of the first buck converter, where the first LA is configured to provide a first modulated supply voltage to a first power amplifier (PA) of a first transmitter via the output terminal of the first LA, and a second LA including a second supply voltage input connected to the output terminal of the buck-boost converter, and an output terminal connected to an output terminal of the second buck converter, where the second LA is configured to provide a second modulated supply voltage to a second PA of a second transmitter via the output terminal of the second LA.

According to some example embodiments, the apparatus further includes a first switch module including a first switch and a second switch; and a second switch module including a third switch and a fourth switch, where a first terminal of the first switch and a first terminal of the second switch are connected to the output terminal of the first buck converter, a first terminal of the third switch and a first terminal of the fourth switch are connected to the output terminal of the second buck converter, a second terminal of the first switch and a second terminal of the third switch are connected to the output terminal of the buck-boost converter, and a second terminal of the second switch and a second terminal of the fourth switch are connected to each other.

According to some example embodiments, the first switch, the second switch, the third switch, and the fourth switch are p-channel metal oxide semiconductor (PMOS) transistors, or n-channel metal oxide semiconductor (NMOS) transistors, or complementary MOS (CMOS) transistors.

According to some example embodiments, the apparatus further includes a first capacitor connected between the second terminal of the first switch or the second terminal of the third switch and ground, where the second terminal of the first switch and the second terminal of the third switch are connected together, and a second capacitor connected between the second terminal of the second switch or the second terminal of the fourth switch and the ground. According to some example embodiments, a capacitance for the first capacitor is between 0.1 μF to 10 μF and a capacitance of the second capacitor is between 0.1 uF to 10 uF.

According to some example embodiments, the buck-boost converter includes a first P-type or complementary metal oxide semiconductor (CMOS) transistor, a source terminal of the first P-type or CMOS transistor is connected to a battery voltage, a first N-type transistor, a drain terminal of the first N-type transistor is connected to a drain terminal of the first P-type or CMOS transistor and a source terminal of the first N-type transistor is connected to ground, a second P-type or CMOS transistor, a source terminal of the second P-type or CMOS transistor is connected to the output terminal of the buck-boost converter, a second N-type transistor, a drain terminal of the second N-type transistor is connected to a drain terminal of the second P-type or CMOS transistor and a source terminal of the second N-type transistor is connected to the ground, and a first inductor connected between the drain terminal of the first P-type or CMOS transistor and the drain terminal of the second P-type or CMOS transistor, where an inductance of the first inductor is between 0.1 μH to 10 μH, and a current carrying capability of the first inductor is greater than 1 A.

According to some example embodiments, the first buck converter includes a first P-type transistor, a source terminal of the first P-type transistor is connected to a battery voltage, a first N-type transistor, a drain terminal of the first N-type transistor is connected to a drain terminal of the first P-type transistor and a source terminal of the first N-type transistor is connected to a ground, a second P-type transistor, where a drain terminal of the second P-type transistor is connected to the drain terminal of the first P-type transistor and the drain terminal of the first N-type transistor, and a source terminal of the second P-type transistor is connected to the output terminal of the buck-boost converter, and a second inductor connected between the drain terminal of the second P-type transistor and the output terminal of the first buck converter, where an inductance of the second inductor is between 0.1 μH to 10 μH, and a current carrying capability of the second inductor is greater than 1 A.

According to some example embodiments, the second buck converter includes a first P-type transistor, a source terminal of the first P-type transistor is connected to a battery voltage, a first N-type transistor, a drain terminal of the first N-type transistor is connected to a drain terminal of the first P-type transistor and a source terminal of the first N-type transistor is connected to a ground, a second P-type transistor, where a drain terminal of the second P-type transistor is connected to the drain terminal of the first P-type transistor and the drain terminal of the first N-type transistor, and a source terminal of the second P-type transistor is connected to the output terminal of the buck-boost converter, and a third inductor connected between the drain terminal of the second P-type transistor and the output terminal of the second buck converter, where an inductance of the third inductor is between 0.1 µH to 10 µH, and a current carrying capability of the third inductor is greater than 1 A.

According to some example embodiments, the apparatus is configured to operate in an average power tracking (APT) mode or in an envelope tracking (ET) mode.

According to some example embodiments, a system includes a buck-boost converter, a first buck converter connected at an output terminal of the buck-boost converter, and a second buck converter connected at the output terminal of the buck-boost converter. According to some example embodiments, the system further includes a first linear amplifier (LA) including a first supply voltage input connected to the output terminal of the buck-boost converter, and an output terminal connected to an output terminal of the first buck converter, and a second LA including a second supply voltage input connected to the output terminal of the buck-boost converter, and an output terminal connected to an output terminal of the second buck converter.

According to some example embodiments, the first LA is configured to provide a first modulated supply voltage to a first power amplifier (PA) of a first transmitter via the output terminal of the first LA and the second LA is configured to provide a second modulated supply voltage to a second PA of a second transmitter via the output terminal of the second LA.

According to some example embodiments, the system further includes a first switch module including a first switch and a second switch, and a second switch module including a third switch and a fourth switch, where a first terminal of the first switch and a first terminal of the second switch are connected to the output terminal of the first buck converter, a first terminal of the third switch and a first terminal of the fourth switch are connected to the output terminal of the second buck converter, a second terminal of the first switch and a second terminal of the third switch are connected to the output terminal of the buck-boost converter, and a second terminal of the second switch and a second terminal of the fourth switch are connected to each other, where the first switch, the second switch, the third switch, and the fourth switch are p-channel metal oxide semiconductor (PMOS) transistors, or n-channel metal oxide semiconductor (NMOS) transistors, or complementary MOS (CMOS) transistors.

According to some example embodiments, the system further includes a first capacitor connected between the second terminal of the first switch or the second terminal of the third switch and ground, where the second terminal of the first switch and the second terminal of the third switch are connected together, and a second capacitor connected between the second terminal of the second switch or the second terminal of the fourth switch and the ground, where a capacitance for the first capacitor is between 0.1 µF to 10 µF and a capacitance of the second capacitor is between 0.1 uF to 10 uF.

According to some example embodiments, the buck-boost converter includes a first P-type or CMOS transistor, a source terminal of the first P-type or CMOS transistor is connected to a battery voltage, a first N-type transistor, a drain terminal of the first N-type transistor is connected to a drain terminal of the first P-type or CMOS transistor and a source terminal of the first N-type transistor is connected to ground, a second P-type or CMOS transistor, a source terminal of the second P-type or CMOS transistor is connected to the output terminal of the buck-boost converter, a second N-type transistor, a drain terminal of the second N-type transistor is connected to a drain terminal of the second P-type or CMOS transistor and a source terminal of the second N-type transistor is connected to the ground, and a first inductor connected between the drain terminal of the first P-type or CMOS transistor the drain terminal of the second P-type or CMOS transistor, where an inductance of the first inductor is between 0.1 µH to 10 µH, and a current carrying capability of the first inductor is greater than 1 A.

According to some example embodiments, the first buck converter includes a first P-type transistor, a source terminal of the first P-type transistor is connected to a battery voltage, a first N-type transistor, a drain terminal of the first N-type transistor is connected to a drain terminal of the first P-type transistor and a source terminal of the first N-type transistor is connected to a ground, a second P-type transistor, where a drain terminal of the second P-type transistor is connected to the drain terminal of the first P-type transistor and the drain terminal of the first N-type transistor, and a source terminal of the second P-type transistor is connected to the output terminal of the buck-boost converter, and a second inductor connected between the drain terminal of the second P-type transistor and the output terminal of the first buck converter, where an inductance of the second inductor is between 0.1 µH to 10 µH, and a current carrying capability of the second inductor is greater than 1 A.

According to some example embodiments, the second buck converter includes a first P-type transistor, a source terminal of the first P-type transistor is connected to a battery voltage, a first N-type transistor, a drain terminal of the first N-type transistor is connected to a drain terminal of the first P-type transistor and a source terminal of the first N-type transistor is connected to a ground, a second P-type transistor, where a drain terminal of the second P-type transistor is connected to the drain terminal of the first P-type transistor and the drain terminal of the first N-type transistor, and a source terminal of the second P-type transistor is connected to the output terminal of the buck-boost converter, and a third inductor connected between the drain terminal of the second P-type transistor and the output terminal of the second buck converter, where an inductance of the third inductor is between 0.1 µH to 10 µH, and a current carrying capability of the third inductor is greater than 1 A.

According to some example embodiments, a method includes receiving an input voltage at an input terminal of an apparatus from a battery source, producing a first output voltage by modulating the input voltage to provide a first supply voltage to a first power amplifier in a first transmitter of an user equipment (UE), and producing a second output voltage by modulating the input voltage to provide a second supply voltage to a second power amplifier in a second transmitter of the UE.

According to some example embodiments, input voltage is modulated by stepping up or stepping down the input voltage to produce the first output voltage according to a desired value of the first supply voltage, and stepping up or stepping down the input voltage to produce the second output voltage according to a desired value of the second supply voltage, where the input voltage is modulated by using a buck-boost converter and at least two buck converters in the apparatus.

According to some example embodiments, the first output voltage is produced at an output terminal of a first linear amplifier (LA) and the second output voltage is produced at an output terminal of a second LA, where each of the first LA and the second LA receives a supply voltage from an output terminal of the buck-boost converter.

BRIEF DESCRIPTION OF THE DRAWINGS

These and other features of some example embodiments of the present invention will be appreciated and understood with reference to the specification, claims, and appended drawings, wherein:

FIG. 10B illustrates a table describing the status (on/off) of the different components of the SM of FIG. 10A during different modes of operation and the outputs of the SM of FIG. 10A at the output terminals, according to some example embodiments of the present invention.

DETAILED DESCRIPTION

Figure 1A:
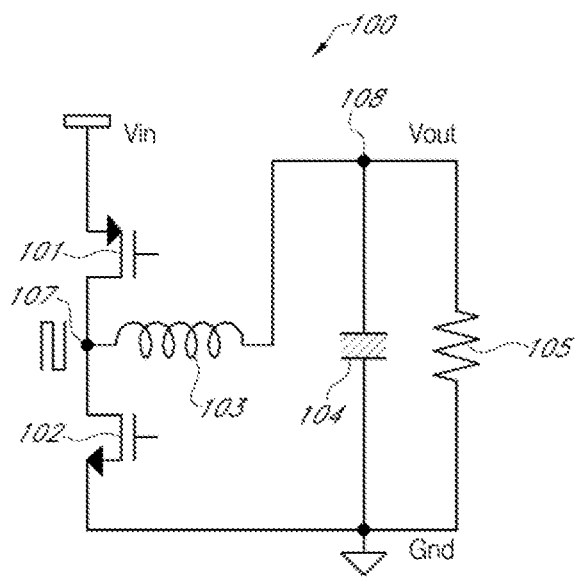
FIG. 1A illustrates a schematic diagram of a buck converter, according to some example embodiments of the present invention.

The detailed description set forth below in connection with the appended drawings is intended as a description of some example embodiments of a system and method relating to a supply modulator for power amplifier provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

Envelope tracking (ET) technologies are gaining popularity in the field of wireless telecommunication (e.g., long term evolution (LTE)), as the ET technologies may provide significant power savings in the wireless telecommunication devices (e.g., LTE user equipment (UE)) and also improve efficiency of the radio frequency (RF) amplifiers. In an ET system, the baseband signal and the envelope signal may be generated by a signal processor (e.g., DSP), and a supply voltage for a power amplifier (PA) may be generated by a supply modulator (SM) that uses a direct-current-to-direct-current (DC-DC) converter. The output of the PA may be correlated with the ET signal generated by the SM. Also in an ET system, to achieve optimal tracking, it may be desirable to have the DC-DC converter's bandwidth higher than the in-band signal bandwidth to reduce SM's bandwidth well below the switching frequency to provide attenuation to the switching harmonics. Switching losses may be reduced by reducing the SM's bandwidth and clock frequency.

Uplink (UL) carrier aggregation (CA) and high power (HP) UE are proposed in recent LTE 3GPP standard. UL-CA increases data rate by aggregating intra-band or inter-band carriers, and uses an SM IC to generate independently controlled supply voltages for the transmitter (TX) paths. A new HP UE standard named "Power Class 2" intended for time division duplex (TDD) LTE Band 41, allows 26 dBm output power which is 3 dB higher than the Power Class 3. To achieve 26 dBm output for a high-voltage RF PA targeting Power Class 2, it may be desirable for a SM to have both larger current drivability and voltage boosting capability above battery range. However, conventional SM integrated circuits (ICs) support only Power Class 3 RF-PA with intra-band contiguous CA up to 40 MHz bandwidth in an ET operation. Therefore, in order to support intra-band and inter-band non-contiguous CA, a typical ET system may require two SM-ICs with double the external components occupying the majority of the printed circuit board (PCB) area in a UE (e.g., cellular handset). Therefore, some example embodiments may include a single chip SM-IC with two independently controlled TX outputs supporting Power Class 2, which may save the overall system cost and the occupied PCB area, and may also achieve a relatively high system-power efficiency and low receiver-band noise.

An SMPS provides a regulated DC supply that can deliver more power for a given size, cost, and weight of a power unit and are used in a variety of electronic equipment, including computers and other sensitive equipment requiring stable and efficient power supply. SMPS has high efficiency and converts power using switching devices that are turned on and off at high frequencies, and storage components to supply power when the switching device is in its non-conduction state.

FIG. 1A illustrates a schematic diagram of a buck (step-down) converter 100. The buck converter 100 may be used in an SMPS circuit to achieve a DC output voltage Vout that is lower than a DC input voltage Vin. The buck converter 100 includes a p-channel metal oxide semiconductor (PMOS) transistor 101, an n-channel MOS (NMOS) transistor 102, an inductor 103, a capacitor 104, and a load, depicted as a resistor 105.

A source of the PMOS transistor 101 may be connected to the input voltage Vin and a drain of the PMOS transistor 101 may be connected to a node 107. A gate voltage may be applied to the gate of the PMOS transistor 101 to turn on the PMOS transistor 101. A drain of the NMOS transistor 102 may be connected to the node 107 and a source of the NMOS transistor 102 may be connected to the ground. A gate voltage may be applied to the gate of the NMOS transistor 102 to turn on the NMOS transistor 102. The inductor 103 may be connected between the node 107 and a node 108. The capacitor 104 may be connected between the node 108 and the ground. The resistive load 105 may also be connected between the node 108 and the ground. The output voltage Vout of the buck converter 100 may be measured across the resistive load 105 or at the node 108. The PMOS transistor 101 and the NMOS transistor 102 may be alternatively turned on/off.

Figure 1B:
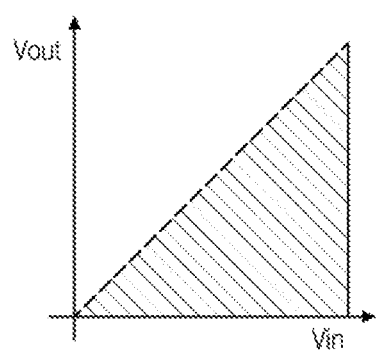
FIG. 1B illustrates a graphical representation of the output characteristics of the buck converter of FIG. 1A, according to some example embodiments of the present invention.

FIG. 1B illustrates a graphical representation of the output characteristics of the buck converter 100. In FIG. 1B, the output voltage Vout of the buck converter 100 is plotted along the Y-axis and the input voltage Vin of the buck converter 100 is plotted along the X-axis to illustrate the step down characteristics of the buck converter 100. As shown in FIG. 1B, Vout is less than Vin.

Figure 2A:
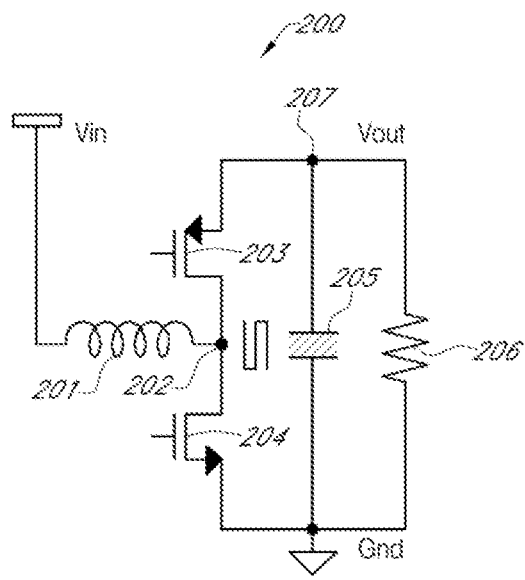
FIG. 2A illustrates a schematic diagram of a boost converter, according to some example embodiments of the present invention.

FIG. 2A illustrates a schematic diagram of a boost (step-up) converter 200. The boost converter 200 may be used in an SMPS circuit to achieve a DC output voltage Vout that is higher than a DC input voltage Vin. The boost converter 200 includes an inductor 201, a PMOS transistor 203, an NMOS transistor 204, a capacitor 205, and a load, depicted as a resistor 206.

The inductor 201 may be connected between the input voltage source Vin and a node 202. A source of the PMOS transistor 203 may be connected to a node 207 and a drain of the PMOS transistor 203 may be connected to the node 202. A gate voltage may be applied to the gate of the PMOS transistor 203 to turn on the PMOS transistor 203. A drain of the NMOS transistor 204 may be connected to the node 202 and a source of the NMOS transistor 204 may be connected to the ground. The capacitor 205 may be connected between the node 207 and the ground. The resistive load 206 may also be connected between the node 207 and the ground. The output voltage Vout of the boost converter 200 may be measured across the resistive load 206 or at the node 207. The PMOS transistor 203 and the NMOS transistor 204 may be alternatively turned on/off.

Figure 2B:
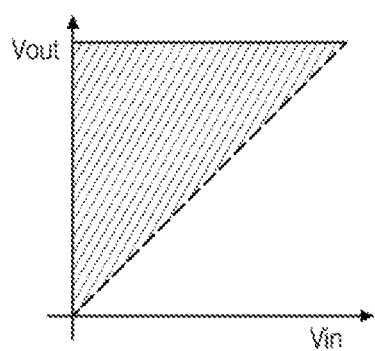
FIG. 2B illustrates a graphical representation of the output characteristics of the boost converter of FIG. 2A, according to some example embodiments of the present invention.

FIG. 2B illustrates a graphical representation of the output characteristics of the boost converter 200. In FIG. 2B, the output voltage Vout of the boost converter 200 is plotted along the Y-axis and the input voltage Vin of the boost converter 200 is plotted along the X-axis to illustrate the step up characteristics of the boost converter 200. As in FIG. 2B, Vout is greater than Vin.

Figure 3A:
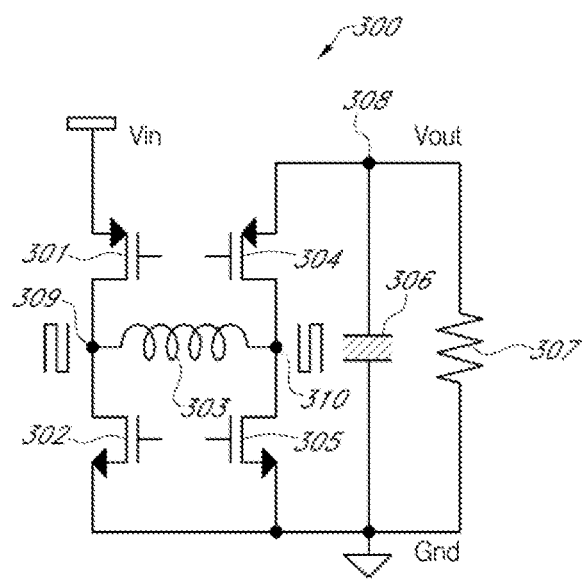
FIG. 3A illustrates a schematic diagram of a buck-boost converter, according to some example embodiments of the present invention.

FIG. 3A illustrates a schematic diagram of a buck-boost (step up/step down) converter 300. The buck-boost converter 300 may be used in an SMPS circuit to achieve a DC output voltage Vout that may be higher or lower than a DC input voltage Vin. The buck-boost converter 300 may operate as either a buck (step down) converter in buck mode or a boost (step up) converter in boost mode.

The buck-boost converter 300 includes a first PMOS transistor 301, a first NMOS transistor 302, a second PMOS transistor 304, a second NMOS transistor 305, an inductor 303, a capacitor 306, and a load, depicted as a resistor 307. A source of the first PMOS transistor 301 may be connected to the input voltage Vin and a drain of the first PMOS transistor 301 may be connected to a node 309. A gate voltage may be applied to the gate of the first PMOS transistor 301 to turn on the first PMOS transistor 301. A drain of the first NMOS transistor 302 may be connected to the node 309 and a source of the first NMOS transistor 302 may be connected to the ground. A gate voltage may be applied to the gate of the first NMOS transistor 302 to turn on the first NMOS transistor 302. The inductor 303 may be connected between the node 309 and a node 310. A source of the second PMOS transistor 304 may be connected to a node 308 and a drain of the second PMOS transistor 304 may be connected to the node 310. A gate voltage may be applied to the gate of the second PMOS transistor 304 to turn on the second PMOS transistor 304. A drain of the second NMOS transistor 305 may be connected to the node 310 and a source of the second NMOS transistor 305 may be connected to the ground. The capacitor 306 may be connected between the node 308 and the ground. The resistive load 307 may also be connected between the node 308 and the ground. The output voltage Vout of the buck-boost converter 300 may be measured across the resistive load 307 or at the node 308.

Figure 3B:
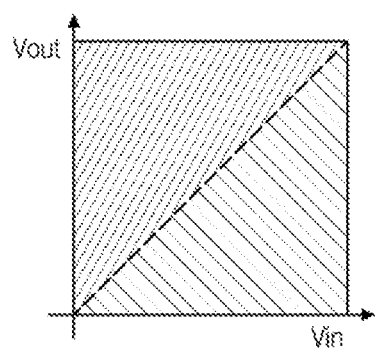
FIG. 3B illustrates a graphical representation of the output characteristics of the buck-boost converter of FIG. 3A, according to some example embodiments of the present invention.

When the buck-boost converter 300 is operating in buck mode, the first PMOS transistor 301 and the first NMOS transistor 302 may be alternatively turned on/off. In buck mode, the second PMOS transistor 304 and the second NMOS transistor 305 are turned off. When the buck-boost converter 300 is operating in boost mode, the second PMOS transistor 304 and the second NMOS transistor 305 may be alternatively turned on/off. In boost mode, the first PMOS transistor 301 and the first NMOS transistor 302 are turned off FIG. 3B illustrates a graphical representation of the output characteristics of the buck-boost converter 300. In FIG. 3B, the output voltage Vout of the buck-boost converter 300 is plotted along the Y-axis and the input voltage Vin of the buck-boost converter 300 is plotted along the X-axis to illustrate the step down/step up characteristics of the buck-boost converter 300. As in FIG. 3B, Vout may be less than, equal to, or greater than Vin.

In an example, the efficiency of each of the buck (100), boost (200), and buck-boost (300) converters is theoretically 100%. However, losses occur due to path resistance and parasitic capacitance. While the buck (100), boost (200), and buck-boost (300) converters have high efficiency, they may exhibit low speed.

Figure 4A:
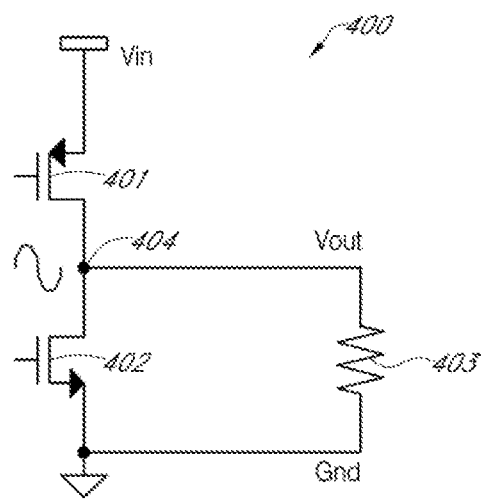
FIG. 4A illustrates a schematic diagram of a linear amplifier (LA), according to some example embodiments of the present invention.

FIG. 4A illustrates a schematic diagram of a linear amplifier (LA) 400. An LA is an electronic circuit whose output is proportional to its input (e.g., Vout may be much less than Vin), and is capable of delivering more power into a load. There are different classes of LA (e.g., class A, class B, class AB, etc.). A class A LA exhibits good linearity in both single-ended and push-pull topologies. Class B and class AB LAs exhibit linearity only in the push-pull topology, in which two active elements (e.g., transistors) are used to amplify positive and negative parts of an RF cycle respectively. The LA 400 of FIG. 4A includes a PMOS transistor 401, an NMOS transistor 402, and a load represented by a resistor 403. A source of the PMOS transistor 401 may be connected to the input voltage Vin and a drain of the PMOS transistor 401 may be connected to a node 404. A gate voltage may be applied to the gate of the PMOS transistor 401 to turn on the PMOS transistor 401. A drain of the NMOS transistor 402 may be connected to the node 404 and a source of the NMOS transistor 402 may be connected to the ground. A gate voltage may be applied to the gate of the NMOS transistor 402 to turn on the NMOS transistor 402. The resistive load 403 may also be connected between the node 404 and the ground. The output voltage Vout of the LA 400 may be measured across the resistive load 403 or at the node 404.

Figure 4B:
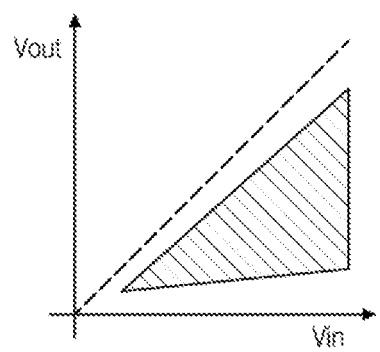
FIG. 4B illustrates a graphical representation of the output characteristics of the LA of FIG. 4A, according to some example embodiments of the present invention.

FIG. 4B illustrates a graphical representation of the output characteristics of the LA 400. In FIG. 4B, the output voltage Vout of the LA 400 is plotted along the Y-axis and the input voltage Vin of the LA 400 is plotted along the X-axis. The output of the LA 400 is proportional to its input and an efficiency of the LA 400 may be theoretically 0% to approximately 78.5% ($\pi/4$) due to the voltage drops of the technology (e.g. complementary MOS (CMOS)) in which the LA 400 is implemented. While the LA 400 may have low efficiency, it can exhibit high speed. In the contrary, a switching converter (e.g., buck converter 100, boost converter 200, buck-boost converter 300) may have low speed but high efficiency. Therefore, a hybrid converter, which may be a combination of a switching converter and a linear amplifier, may be desirable to achieve both high speed and high efficiency.

Figure 5A:
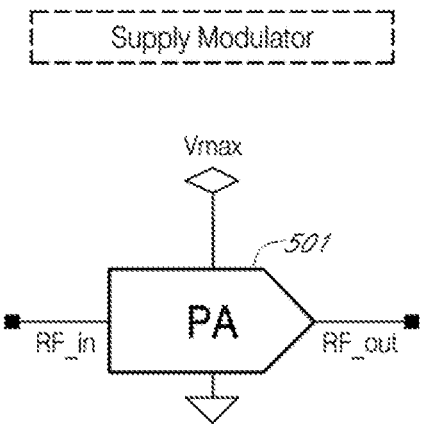
FIG. 5A illustrates a block diagram of a power amplifier (PA), according to some example embodiments of the present invention.

FIG. 5A illustrates a block diagram of a PA 501 with a fixed supply voltage (e.g., Vmax). The PA 501 has a supply voltage that is fixed for all RF input signals RF_in provided to an input of the PA 501. For each RF_in signal, the PA 501 outputs an RF signal RF_out.

Figure 5B:
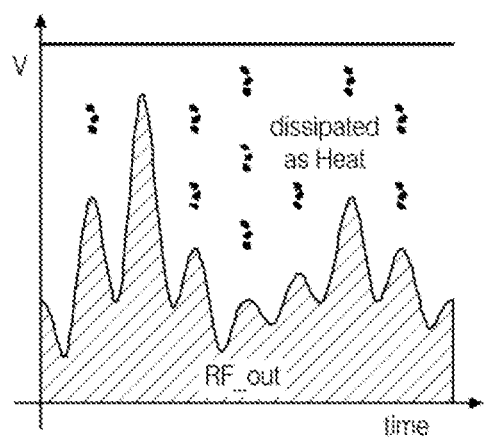
FIG. 5B illustrates a graphical representation of a radio frequency (RF) output (RF_out) signal of the PA of FIG. 5A with respect to the supply voltage of the PA of FIG. 5A, according to some example embodiments of the present invention.

FIG. 5B illustrates a graphical representation of an RF_out signal of the PA 501 with respect to the supply voltage (e.g. Vmax) of the PA 501. In the example graphical representation of FIG. 5B, the supply voltage of PA 501 remains constant and is independent of the RF_out signal. The PA 501 with a fixed supply voltage is inefficient, as a difference between the supply voltage level and the voltage level of the RF_out signal is dissipated as heat in the PA 501 instead of being used for operational purposes.

Figure 6A:
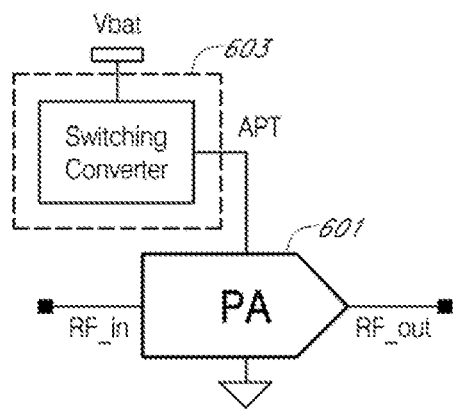
FIG. 6A illustrates a block diagram of a PA, according to some example embodiments of the present invention.

FIG. 6A illustrates a block diagram of a PA 601 with a first supply voltage based on a fixed supply voltage (e.g., Vmax) and an second supply voltage based on average power tracking (APT). The PA 601 is provided with the first supply voltage when an RF_out signal is above a first predetermined voltage level and is provided with the second supply voltage when an RF_out signal is below a second predetermined voltage level. The second supply voltage is lower than the first supply voltage and the first predetermined voltage level and the second predetermined voltage level may be the same or different. In an example, the second supply voltage may be determined as a function of tracking the average power of the PA 601 and adjusting the supply voltage according to the average power, which may be referred to as APT.

In an example, the PA 601 may receive the second supply voltage via a switching converter 603. The supply voltage to the switching converter 603 may be a battery voltage (Vbat).

During APT mode of operation of the PA 601, a high voltage is supplied as the first supply voltage when the RF_out signal is above the first predetermined voltage level, and a low voltage is supplied as the second supply voltage when the RF_out signal is below the second predetermined voltage level.

Figure 6B:
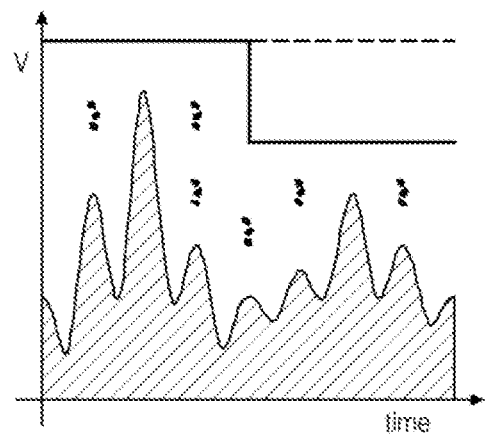
FIG. 6B illustrates a graphical representation of an RF_out signal with respect to the first supply voltage and the second supply voltage of the PA of FIG. 6A, according to some example embodiments of the present invention.

FIG. 6B illustrates a graphical representation of an RF_out signal with respect to the first supply voltage and the second supply voltage. In an example, the supply voltage (e.g., first supply voltage and second supply voltage) may be high when the RF_out signal is above the first predetermined voltage level, but is reduced when the RF_out signal is below the second predetermined voltage level. As in PA 601, the supply voltage is lowered in APT mode when the RF_out signal is below the second predetermined voltage level. The PA 601 exhibits lower power loss compared to the PA 501 of FIG. 5A. As such, the PA 601 may be more efficient than the PA 501.

Figure 7A:
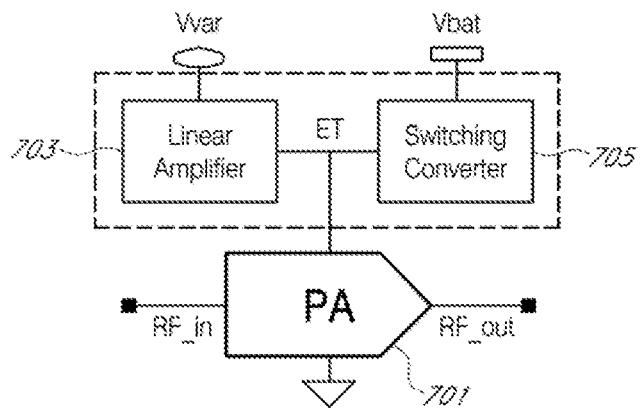
FIG. 7A illustrates a block diagram of a PA, according to some example embodiments of the present invention.

FIG. 7A illustrates a block diagram of a PA 701 with a supply voltage waveform based on ET. The PA 701 of FIG. 7A is provided with a supply voltage that tracks the RF_out signal. That is, in the example embodiment of FIG. 7A, the supply voltage of the PA 701 is modulated to track an envelope of the RF_out signal. This is commonly referred to as ET. The PA 701 includes an LA 703 with a variable supply voltage (Vvar) and a switching converter 705 with a supply voltage of Vbat. When the PA 701 is operating in the ET mode, a supply voltage waveform that tracks the RF_out signal is supplied to the PA 701.

Figure 7B:
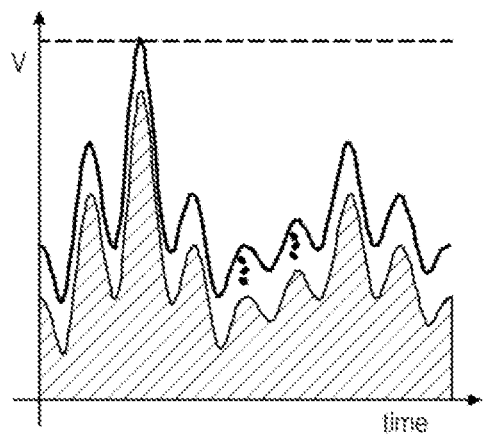
FIG. 7B illustrates a graphical representation of the output signal (RF_out) of the PA of FIG. 7A with respect to the supply voltage waveform, according to some example embodiments of the present invention.

FIG. 7B illustrates a graphical representation of the output signal (RF_out) of the PA 701 with respect to the supply voltage waveform. Since the supply voltage of the PA 701 tracks the RF_out signal while in ET mode, the PA 701 exhibits lower power loss than the PA 501 of FIG. 5A and the PA 601 of FIG. 6A. As such, the PA 701 may be more efficient than the PA 501 and the PA 601.

Figure 8A:
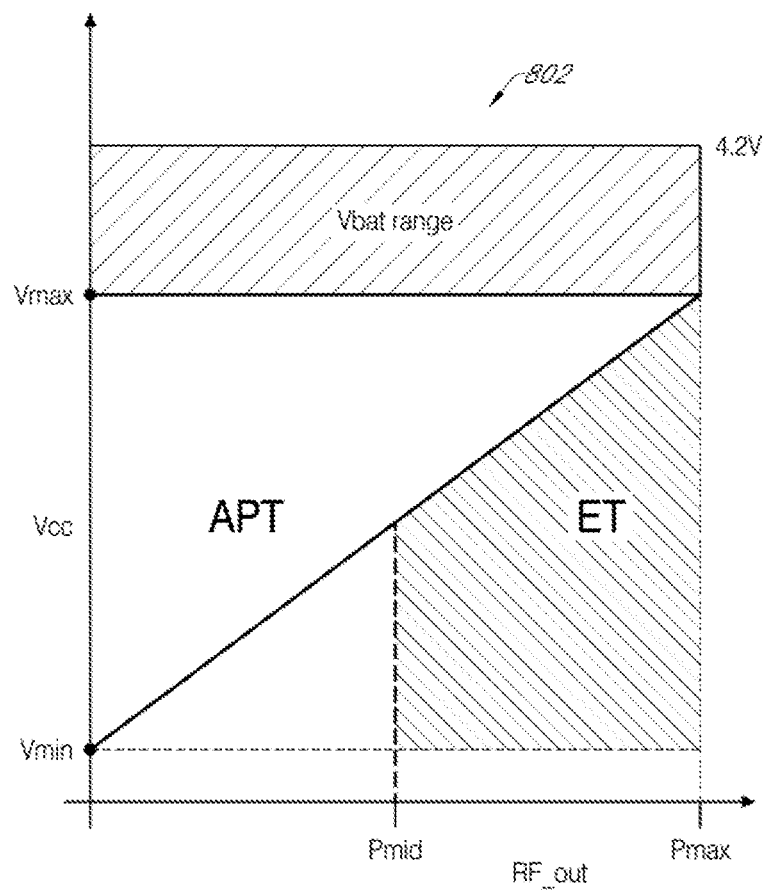
FIG. 8A illustrates a graphical representation of the output characteristics of a PA under low power operation (LP-PA), according to some example embodiments of the present invention.

FIG. 8A illustrates a graphical representation 802 of the output characteristics of a PA (e.g., 501, 601, 701) under low power operation (LP-PA). For example, the maximum supply voltage Vmax of the LP-PA may be less than the minimum battery voltage (e.g., Vbat,min). In FIG. 8A, output voltage RF_out of the LP-PA is plotted along the X-axis and the supply voltage, Vcc of the LP-PA is plotted along the Y-axis. The LP-PA may operate in an APT mode (e.g., low voltage APT) or an ET mode (e.g., low voltage ET).

Figure 8B:
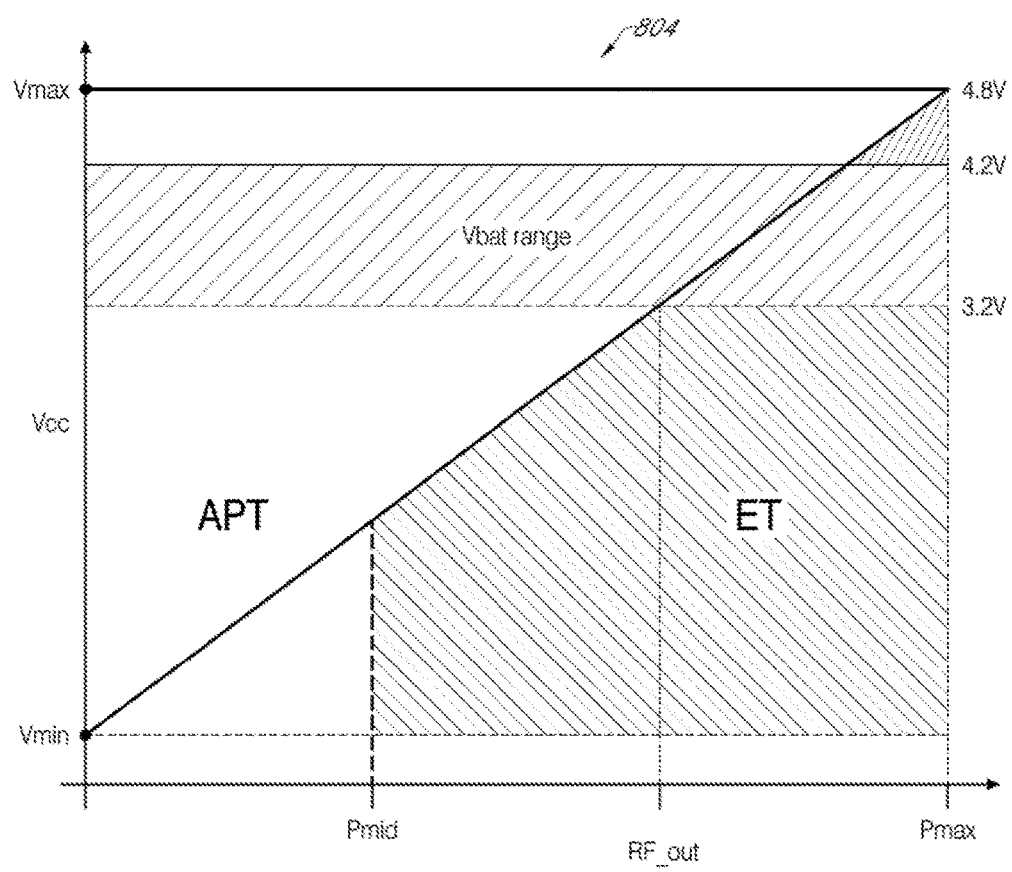
FIG. 8B illustrates a graphical representation of the output characteristics of a PA under high power operation (HP-PA), according to some example embodiments of the present invention.

FIG. 8B illustrates a graphical representation 804 of the output characteristics of a PA (e.g., 501, 601, 701) under high power operation (HP-PA). For example, the maximum supply voltage Vmax (4.8 V) of the HP-PA may be greater than the minimum battery voltage (Vbat,min). The HP-PA may operate in an APT mode (e.g., high voltage APT) or an ET mode (e.g., high voltage ET).

Figure 9A:
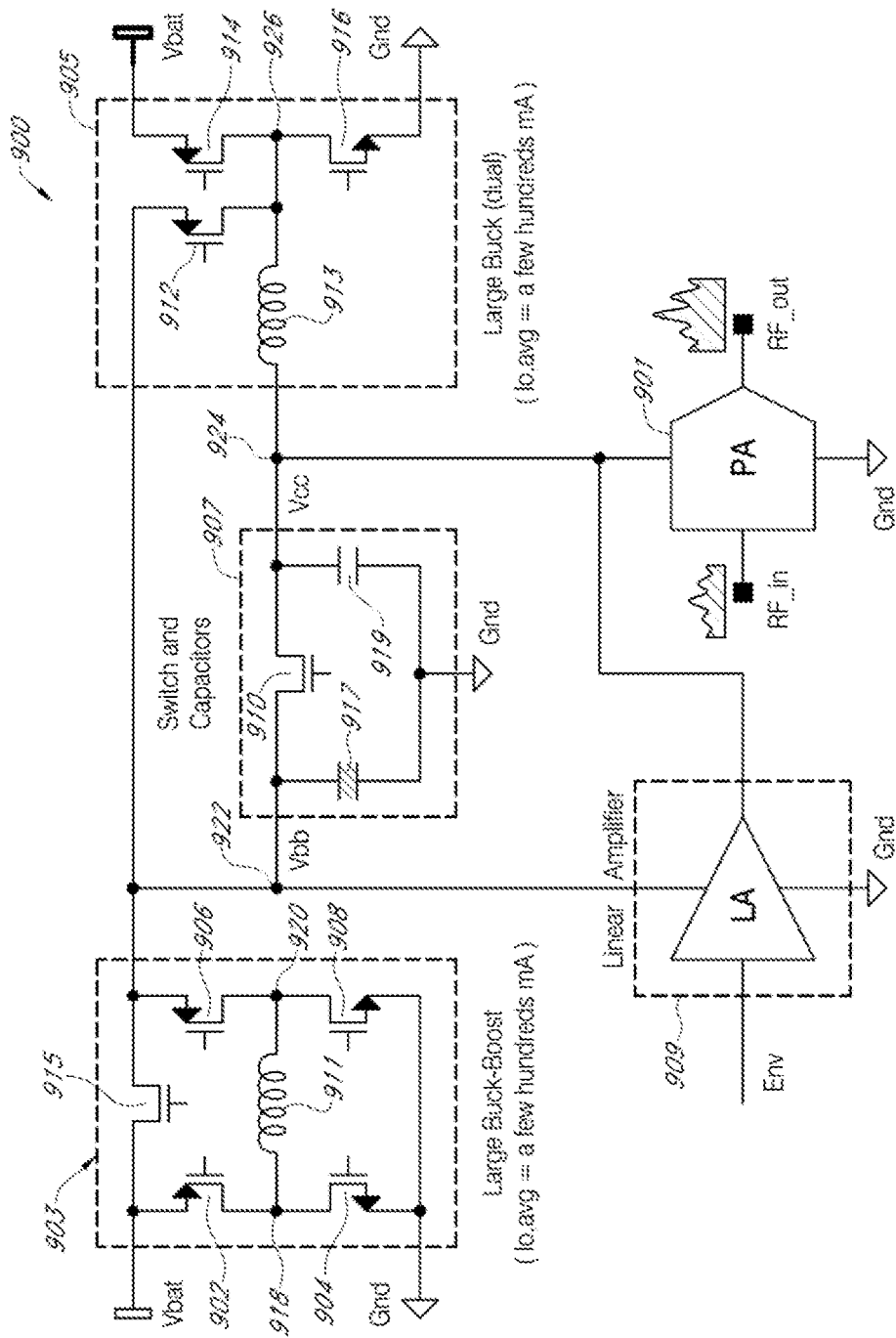
FIG. 9A illustrates block diagram of a supply modulator (SM) of a PA, according to some example embodiments of the present invention.

FIG. 9A illustrates block diagram of an SM 900 of a PA 901, according to an example embodiment of the present disclosure. The SM 900 may be connected to the PA 901. The SM 900 may include a buck-boost converter 903, a buck (dual) converter 905, a switch and capacitors module 907, and an LA 909.

The buck-boost converter 903 of FIG. 9A includes a first inductor 911, a pass transistor 915 for passing current, a first PMOS transistor 902, a first NMOS transistor 904, a second PMOS transistor 906, and a second NMOS transistor 908. The pass transistor 915 may be an NMOS transistor, a PMOS transistor, or an NMOS transistor and a PMOS transistor connected as a CMOS switch. A transistor of an embodiment of the present disclosure is not limited to any particular transistor type, but may include any suitable transistor type (e.g. an NMOS transistor, a PMOS transistor, or an NMOS transistor and a PMOS transistor connected as a CMOS switch).

In FIG. 9A, a source of the first PMOS transistor 902 may be connected to the battery voltage Vbat and a drain of the first PMOS transistor 902 may be connected to a node 918. A gate voltage may be applied to the gate of the first PMOS transistor 902 to turn on the first PMOS transistor 902. A drain of the first NMOS transistor 904 may be connected to the node 918 and a source of the first NMOS transistor 904 may be connected to the ground. A gate voltage may be applied to the gate of the first NMOS transistor 904 to turn on the first NMOS transistor 904. The first inductor 911 may be connected between the node 918 and a node 920. A source of the second PMOS transistor 906 may be connected to a node 922 and a drain of the second PMOS transistor 906 may be connected to the node 920. A gate voltage may be applied to the gate of the second PMOS transistor 906 to turn on the second PMOS transistor 906. A drain of the second NMOS transistor 908 may be connected to the node 920 and a source of the second NMOS transistor 908 may be connected to the ground. The output voltage Vbb of the buck-boost converter 903 may be measured at the node 922.

In the buck-boost converter 903 of FIG. 9A, the inductance of the first inductor 911 may be between 0.1 μH to 10 μH, and a current carrying capability of the first inductor 911 may be greater than 1 A. The first inductor 911 may be referred to as a "large inductor," because of its physical size, which may be approximately 2 mm in length and 2 mm in width. However, as technology develops and the size of such an inductor changes, another size may be used in an embodiment of the present disclosure. In an example, the buck-boost converter 903 may be referred to as a "large buck-boost converter," as the inductance of the first inductor 911 is in the range of 0.1 μH to 10 μH and the current carrying capability of the first inductor 911 is greater than 1 A.

The buck-boost converter 903 is controlled to output a voltage Vbb that is either less than Vbat, when operated in buck mode, or greater than Vbat, when operated in boost mode. Depending on transistor sizes, an average output current in the range of hundreds of mA may be produced at the buck-boost converter 903. In an example, when operating in HV-PA in APT mode, the buck-boost converter 903 may produce an output voltage that is greater than Vbat. However, when operating in ET mode, the buck-boost converter 903 may produce an output voltage that is greater than Vbat for both the LA 909 and the source of the fourth PMOS transistor 912 of the large buck (dual) converter 905. Thus, the large buck (dual) converter 905 may output a voltage greater than Vbat.

In the exemplary embodiment of FIG. 9A, the buck (dual) converter 905 includes a second inductor 913, a third PMOS transistor 914, a fourth PMOS transistor 912, and a third NMOS transistor 916. A source of the fourth PMOS transistor 912 is connected to the output of the buck-boost converter 903 at node 922 and a drain of the fourth PMOS transistor 912 is connected to a node 926. The source of the third PMOS transistor 914 is connected to Vbat and the drain of the third PMOS transistor 914 is connected to the node 926. The drain of the third NMOS transistor 916 is connected to the node 926 and the source of the third NMOS transistor 916 is connected to ground. A first end of the second inductor 913 may be connected to the node 926 and a second end of the second inductor 913 may be connected to node 924, which is the output of the buck (dual) converter 905.

In the buck (dual) converter 905 of FIG. 9A, the inductance of the second inductor 913 may be between 0.1 μH to 10 μH, and a current carrying capability of the second inductor 913 may be greater than 1 A. The second inductor 913 may be referred to as a "large inductor," because of its physical size, which may be approximately 2 mm in length and 2 mm in width. However, as technology develops and the size of such an inductor 913 changes, another size may be used in an embodiment of the present disclosure. In an example, the buck (dual) converter 905 may be referred to as a "large buck (dual) converter," as the inductance of the second inductor 913 is in the range of 0.1 μH to 10 μH and the current carrying capability of the second inductor 913 is greater than 1 A.

In an example, when operating in LV-PA in APT mode, the buck (dual) converter 905 may produce an output voltage Vcc that is less than Vbat. However, when operating in ET mode, the buck (dual) converter 905 may produce an output voltage Vcc that is either less than or greater than Vbat to track the envelope of the RF_out signal of the PA 901. Depending on transistor sizes, an average output current in the range of hundreds of mAs may be produced at the buck (dual) converter 905. In an example, the buck (dual) converter 905 may be referred to as a "large buck (dual) converter," as the inductance of the second inductor 913 is in the range of 0.1 μH to 10 μH and the current carrying capability of the second inductor 913 is greater than 1 A. Since the large buck-boost converter 903 may produce an output voltage Vbb greater than the supply battery voltage Vbat and the large buck (dual) converter 905 may produce an output voltage Vcc greater than the supply battery voltage Vbat via the fourth PMOS transistor 912 connected to the output (at node 922) of the large buck-boost converter 903, the SM 900 may exhibit improved efficiency compared to conventional SMs due to less power loss.

In an example, the switch and capacitors module 907 includes a transistor 910, a first capacitor 917, and a second capacitor 919. The transistor 910 may be any suitable transistor type (e.g. an NMOS transistor, a PMOS transistor, an NMOS transistor and a PMOS transistor connected as a CMOS switch, etc.). The first capacitor 917 may be connected between the output of the large buck-boost converter 903 (at node 922) and the ground. The first capacitor 917 may have a capacitance value in the range of 0.1 μF to 10 μF. The second capacitor 919 may be connected between the output of the large buck (dual) converter 905 (at node 924) and the ground. The second capacitor 919 may have a capacitance value of a few nF. In an example, the switch and capacitors module 907 may include discrete capacitors that are not integrated with the other components of the SM 900 together on a semiconductor IC or chip. In another example, the switch and capacitors module 907 is integrated with the other components of the SM 900 as part of a semiconductor IC or chip. In an example, first capacitor 917 and the second capacitor 919 of the switch and capacitors module 907 may be connected in parallel to each other for the SM 900 to support LV-PA and HV-PA in APT mode. When the transistor 910 is on, the transistor 910 may connect the first capacitor 917 with the second capacitor 919. However, in ET mode (as illustrated in FIG. 9C), the first capacitor 917 and the second capacitor 919 may be used separately by turning off the transistor 910.

In an example, the LA 909 includes a supply voltage input connected to the output (at node 922) of the large buck-boost converter 903, a ground input connected to ground, an input for receiving an input signal, and an output. The PA 901 includes a supply voltage input connected to the output (at node 924) of the large buck (dual) converter 905 and the output of the LA 909, a ground input connected to ground, an input for receiving an RF signal RF_in, and an output for producing an RF signal RF_out.

Figure 9B:
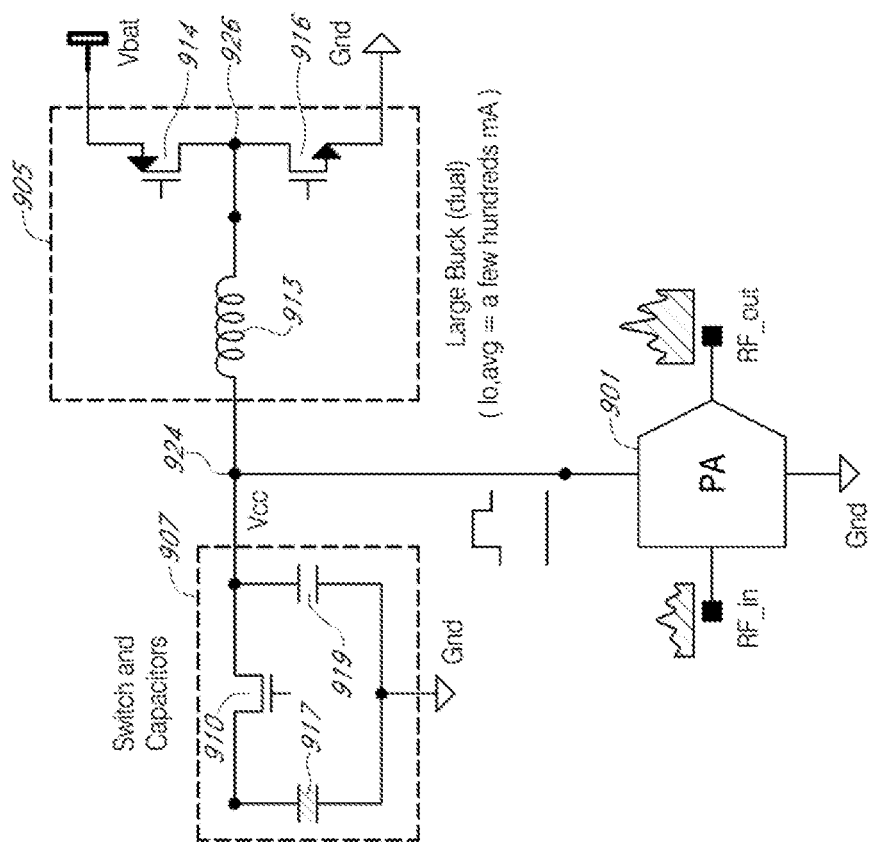
FIG. 9B illustrates a block diagram of the SM of FIG. 9A in average power tracking (APT) mode to support LV-PA, according to some example embodiments of the present invention.

FIG. 9B illustrates a block diagram of the SM 900 of the PA 901 of FIG. 9A in APT mode to support LV-PA, according to an example embodiment of the present disclosure. For LV-PA in the APT mode, SM 900 may be controlled to activate the PA 901, the large buck (dual) converter 905, and the switch and capacitors module 907, and to deactivate the large buck-boost converter 903 and the LA 909. In an example, when the SM 900 is operating in the APT mode, the fourth PMOS transistor 912, the source terminal of which is connected to the output (at node 922) of the deactivated large buck-boost converter 903, is turned off so that the large buck (dual) converter 905 may function as a buck converter. Also, during the APT mode of operation of the SM 900, the transistor 910 of the switch and capacitors module 907 is turned on to connect the first capacitor 917 with the second capacitor 919, and therefore an effective capacitance of the switch and capacitors module 907 may be equal to the sum of the capacitance values of the first capacitor 917 and the second capacitor 919. In an example, in APT mode, the large buck (dual) converter 905 may produce an output voltage Vcc (at node 924) that may be less than the supply battery voltage Vbat, and therefore the SM 900 in APT mode may support LV-PA. In some examples, depending on transistor sizes, the buck (dual) converter 905 may output an average current in the range of hundreds of mAs.

Figure 9C:
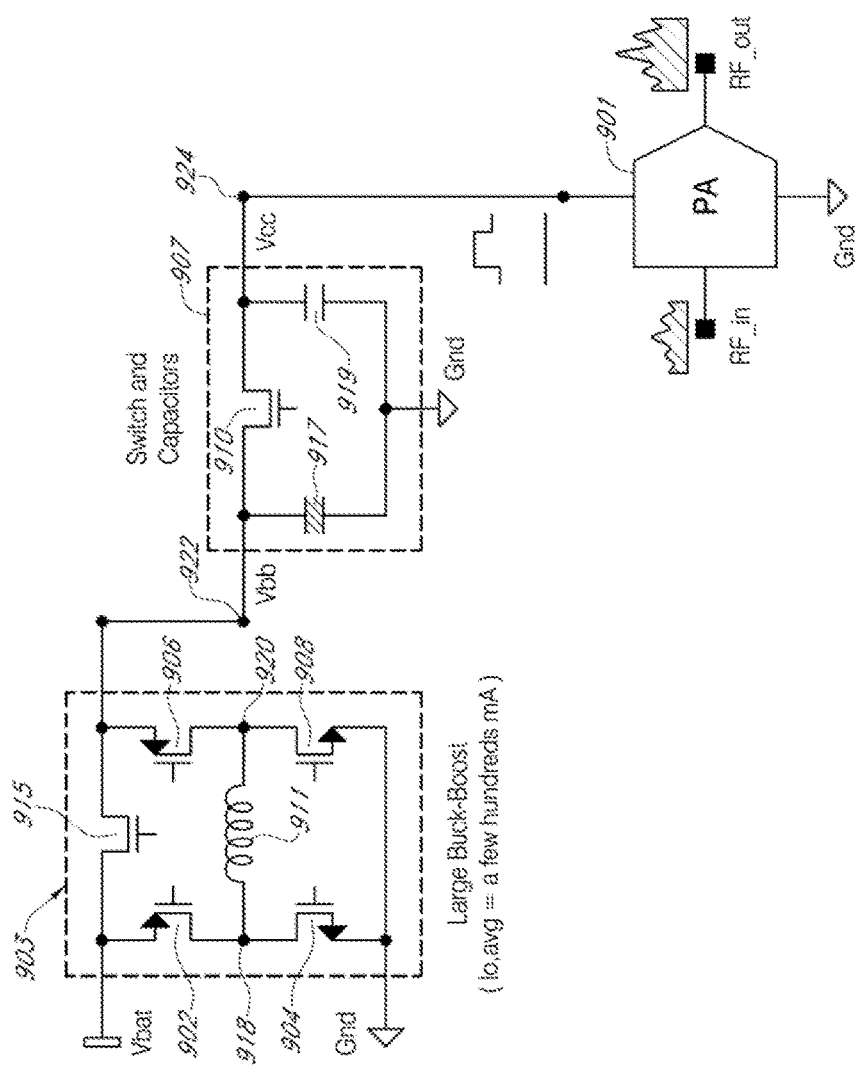
FIG. 9C illustrates a block diagram of the SM of FIG. 9A, in APT mode to support HV-PA, according to some example embodiments of the present invention.

FIG. 9C illustrates a block diagram of the SM 900 of the PA 901 of FIG. 9A, in APT mode to support HV-PA, according to an example embodiment of the present disclosure. For HV-PA in the APT mode, the SM 900 may be controlled to activate the PA 901, the large buck-boost converter 903, and the switch and capacitors module 907, and to deactivate the large buck (dual) converter 905 and the LA 909. In an example, when the SM 900 is operating in the APT mode, the transistor 910 of the switch and capacitors module 907 is turned on to connect the first capacitor 917 with the second capacitor 919, and therefore an effective capacitance of the switch and capacitors module 907 may be equal to the sum of the capacitance values of the first capacitor 917 and the second capacitor 919. In an example, the large buck-boost converter 903 may produce an output voltage Vbb (at node 922) that may be greater than the supply battery voltage Vbat, and therefore the SM 900 in APT mode may support HV-PA. In some examples, depending on transistor sizes, the large buck-boost converter 903 may output an average current in the range of hundreds of mAs.

Figure 9D:
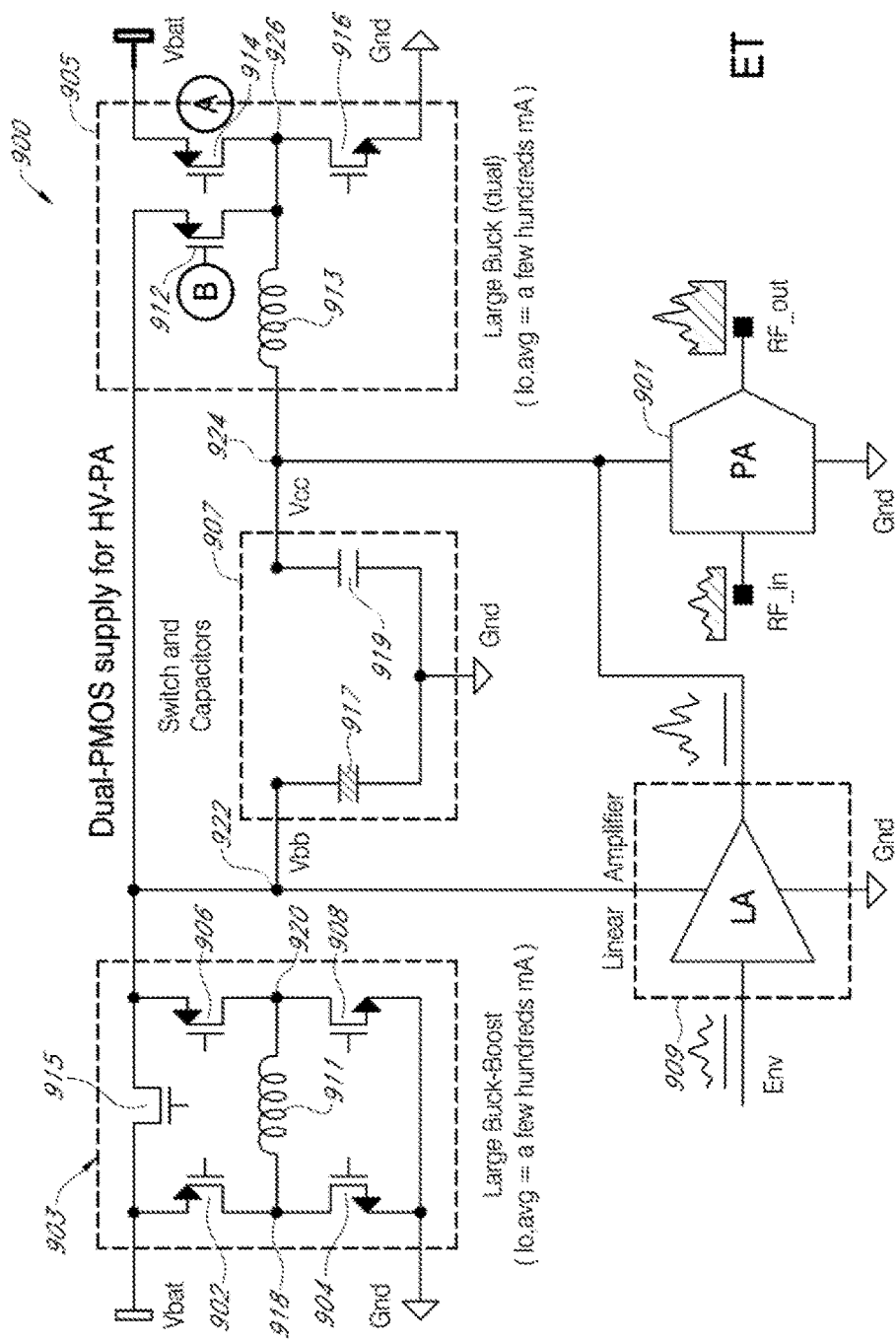
FIG. 9D illustrates a block diagram of the SM of FIG. 9A, in envelope tracking (ET) mode to support HV-PA, according to some example embodiments of the present invention.

FIG. 9D illustrates a block diagram of the SM 900 of the PA 901 of FIG. 9A, in ET mode to support HV-PA, according to an example embodiment of the present disclosure. For HV-PA in the ET mode, the SM 900 may be controlled to activate the PA 901, the large buck-boost converter 903, the large buck (dual) converter 905, the switch and capacitors module 907, and the LA 909. In an example, when the SM 900 is operating in the ET mode, the fourth PMOS transistor 912 of the large buck (dual) converter 905 may be turned on to connect to the large buck-boost converter 903. In the example embodiment of FIG. 9D, when operating in ET mode, the large buck (dual) converter 905 of the SM 900 may produce an output voltage Vcc (at node 924) greater than the supply battery voltage Vbat.

In one configuration, the transistor 910 (as shown in FIGS. 9A-9C) of the switch and capacitors module 907 may be turned off so that the first capacitor 917 and the second capacitor 919 may operate separately. Therefore, when operating in ET mode, the large buck-boost converter 903 may output a voltage Vbb (at node 922) that is greater than the supply battery voltage Vbat, and the large buck (dual) converter 905 may output a voltage Vcc (at node 924) that is greater than the supply battery voltage Vbat. In an example, depending on transistor sizes, each of the large buck-boost converter 903 and the buck (dual) converter 905 may output an average current in the range of hundreds of mAs. Since, when operating in ET mode, the large buck-boost converter 903 and the large buck (dual) converter 905 can each output a voltage (Vbb or Vcc) greater than the supply battery voltage Vbat, the SM 900 operating in the ET mode may supply voltages to the LA 909 that are used to track the envelope of the RF_out signal of the PA 901.

Figure 10A:
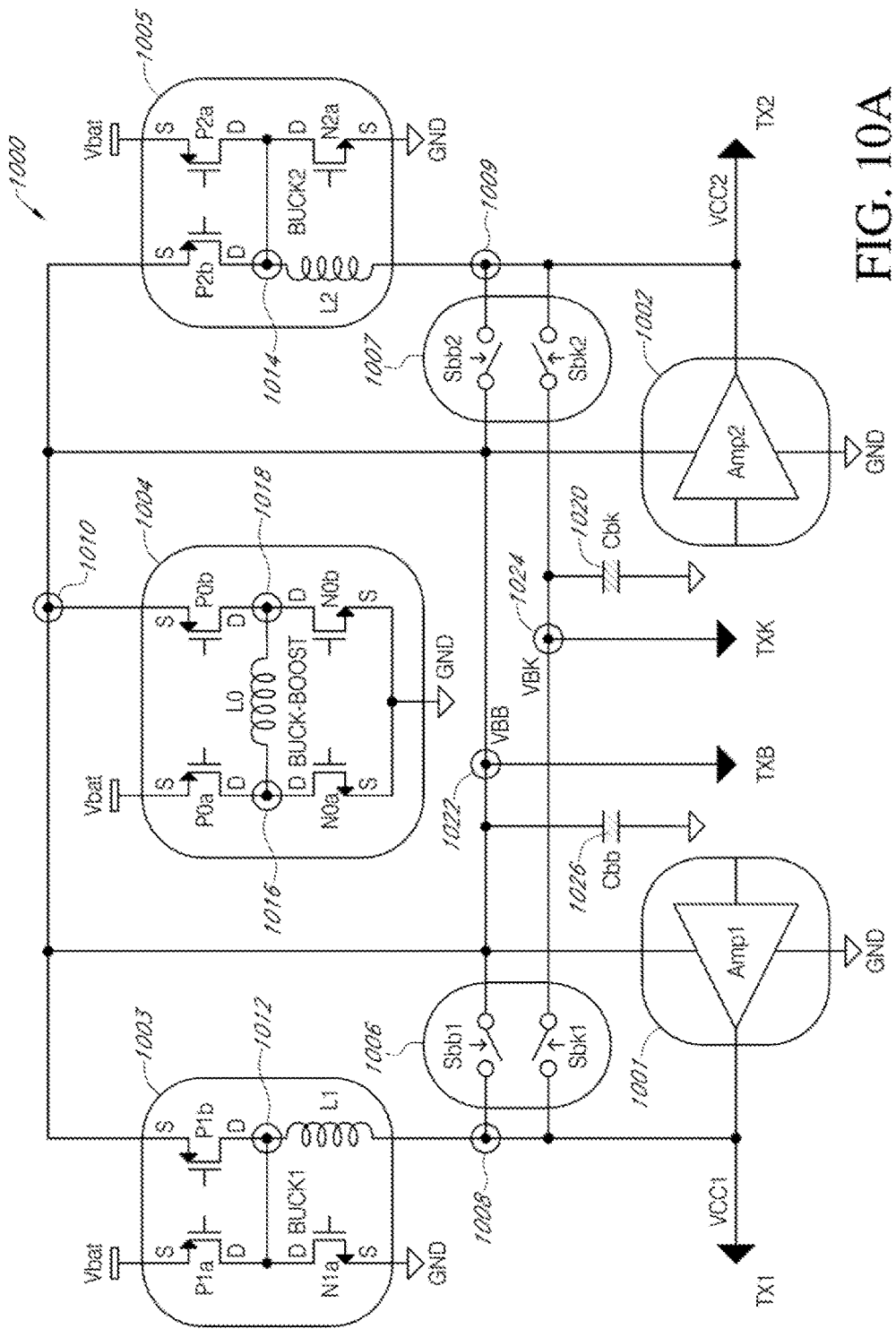
FIG. 10A illustrates block diagram of an SM, according to some example embodiments of the present invention.

FIG. 10A illustrates block diagram of an SM 1000, according to an example embodiment of the present disclosure. The SM 1000 may include a first dual supply buck converter 1003, a buck-boost converter 1004, a second dual supply buck converter 1005, a first switch module 1006, a second switch module 1007, a first capacitor Cbb 1026, a second capacitor Cbk 1020, and two class AB LAs 1001 and 1002. The outputs of the LAs 1001 and 1002 may be connected to PAs.

The first buck converter 1003 may include two PMOS transistors P1a and P1b, an NMOS transistor N1a, and an inductor L1. A source terminal of the PMOS transistor P1a may be connected to a battery voltage Vbat. A drain terminal of the PMOS transistor P1a may be connected to the drain terminal of the NMOS transistor N1a. The source terminal of the NMOS transistor N1a may be connected to the ground. The drain of the PMOS transistor P1a and the drain of the NMOS transistor N1a may also be connected to the drain terminal of the PMOS transistor P1b at node 1012. A source terminal of the PMOS transistor P1b may be connected to the supply voltage input of the LA 1001 and to an output node 1010 of the buck-boost converter 1004. The inductor L1 of the first buck converter 1003 may be connected between the node 1012 and a node 1008. The output voltage of the first buck converter 1003 may be measured at the node 1008.

The buck-boost converter 1004 may include two PMOS transistors P0*a* and P0*b*, two NMOS transistors N0*a* and N0*b*, and an inductor L0. A source terminal of the PMOS transistor P0*a* may be connected to a battery voltage Vbat and a drain terminal of the PMOS transistor P0*a* may be connected to a node 1016. A drain terminal of the NMOS transistor N0*a* may be connected to the node 1016 and a source terminal of the first NMOS transistor N0*a* may be connected to the ground. A source terminal of the PMOS transistor P0*b* may be connected to the node 1010 and a drain terminal of the PMOS transistor P0*b* may be connected to a node 1018. A drain terminal of the NMOS transistor N0*b* may be connected to the node 1018 and a source of the NMOS transistor N0*b* may be connected to the ground. The inductor L0 may be connected between the node 1016 and the node 1018. The output voltage (VBB) of the buck-boost converter 1004 may be measured at the node 1010. In an example, the node 1010 may be further connected to the supply voltage inputs of the first LA 1001 and the second LA 1002 and to the node 1022. In an example, a voltage at the node 1022 may be same as the output voltage VBB of the buck-boost converter 1004. In another example, an output TXB may be measured at the node 1022.

The second buck converter 1005 may include two PMOS transistors P2*a* and P2*b*, an NMOS transistor N2*a*, and an inductor L2. A source terminal of the PMOS transistor P2*a* may be connected to a battery voltage Vbat. A drain terminal of the PMOS transistor P2*a* may be connected to the drain terminal of the NMOS transistor N2*a*. The source terminal of the NMOS transistor N2*a* may be connected to the ground. The drain of the PMOS transistor P2*a* and the drain of the NMOS transistor N2*a* may also be connected to the drain terminal of the PMOS transistor P2*b* at node 1014. A source terminal of the PMOS transistor P2*b* may be connected to the supply voltage input of the second LA 1002 and to the output node 1010 of the buck-boost converter 1004. The inductor L2 of the second buck converter 1005 may be connected between the node 1014 and a node 1009. The output voltage of the second buck converter 1005 may be measured at the node 1009.

In one configuration, the inductance of each of the inductors L0, L1, and L2, may be between 0.1 µH to 10 µH, and a current carrying capability of each of the inductors L0, L1, and L2 may be greater than 1 A. Each of the inductors L0, L1, and L2 may be referred to as a "large inductor," because of their physical sizes, which may be approximately 2 mm in length and 2 mm in width. However, as technology develops and the size of such an inductor changes, another size may be used in an embodiment of the present disclosure.

The first switch module 1006 includes two APT switches Sbb1 and Sbk1. A first terminal of the switch Sbb1 may be connected to the node 1008 and a second terminal of the switch Sbb1 may be connected to the node 1022. The second terminal of the switch Sbb1 may further be connected to the source terminal of the PMOS transistor P1*b*, the source terminal of the PMOS transistor P0*b* via node 1010, and the supply voltage input of the first LA 1001. In an example, a voltage at the node 1022 may be same as the output voltage VBB of the buck-boost converter 1004. In another example, an output TXB may be measured at the node 1022. A first terminal of the switch Sbk1 may also be connected to the node 1008 and a second terminal of the switch Sbk1 may be connected to a node 1024. In an example, a voltage at the node 1024 may be same as the output voltage VBK of the first buck converter 1003 or the second buck converter 1005, assuming that the switch Sbk1 or Sbk2 is closed. In an example, an output TXK may be measured at the node 1024.

The second switch module 1007 includes two APT switches Sbb2 and Sbk2. A first terminal of the switch Sbb2 may be connected to the node 1009 and a second terminal of the switch Sbb2 may be connected to the node 1022. The second terminal of the switch Sbb2 may further be connected to the source terminal of the PMOS transistor P2*b*, the source terminal of the PMOS transistor P0*b* via node 1010, and the supply voltage input of the second LA 1002. A first terminal of the switch Sbk2 may also be connected to the node 1009 and a second terminal of the switch Sbk2 may be connected to the node 1024.

In an example, the transistors P0*a* and P0*b* of the SM 1000, may be complementary MOS (CMOS) transistors. In another example, the four APT switches Sbb1, Sbb2, Sbk1, and Sbk2 may be PMOS transistors or CMOS transistors.

In the example embodiment of SM 1000, the first capacitor Cbb 1026 may be connected between the node 1022 and the ground and the capacitor Cbk 1020 may be connected between the node 1024 and the ground. The capacitor Cbb 1026 may have a capacitance value in the range of 0.1 µF to 10 µF. The capacitor Cbk 1020 may have a capacitance value in the range of 0.1 uF to 10 uF.

In an example, the LA 1001 includes a supply voltage input connected to the output (at node 1010) of the buck-boost converter 1004, a ground input connected to ground, an input for receiving an input signal, and an output TX1. In an example, voltage VCC1 at the output TX1 of the LA 1001 may be same as the output voltage of the first buck converter 1003, as the output terminal TX1 of the LA 1001 is connected to the output (at node 1008) of the first buck converter 1003. In an example, the LA 1002 includes a supply voltage input connected to the output (at node 1010) of the buck-boost converter 1004, a ground input connected to ground, an input for receiving an input signal, and an output TX2. In an example, voltage VCC2 at the output TX2 of the LA 1002 may be same as the output voltage of the second buck converter 1005, as the output terminal TX2 of the LA 1002 is connected to the output of the second buck converter 1005 at node 1009.

In one example, the supply voltage for an RF-PA in an UE, operating under Power Class 2 standard, may reaches up to 5.0V. Such a value of the RF-PA supply voltage may be higher than the typical battery voltage range of 3.2V to 4.2V. The buck-boost converter 1004 may be used to step up the battery voltage Vbat in order to provide the required supply voltage of 5.0 V to an RF-PA of a transmitter in a high power UE operating under Power Class 2. In an example, the buck-boost converter 1004 may act as an additional power source for the buck converts 1003 and 1005.

In an UE, in order to implement two transmitters (TX1, TX2) within a single die, it may be simpler to use two separate SMs, each including a buck-boost converter, a buck converter, and a LA, where each transmitter may have a dedicated SM. A buck-boost converter is area hungry (occupies significant amount of die area) and includes an external power inductor (e.g., L0 of FIG. 10A). If two transmitters are to be implemented in a single die in an UE, with each transmitter having its own dedicated SM, such structure may require a significant portion of the die area and the number of external components may increase significantly as well.

In order to derive a benefit of a single chip or to efficiently utilize the die space while implementing two transmitters in a single die without unduly increasing the total number of external components, the example embodiment of FIG. 10A utilizes a single SM 1000 to be shared between the two transmitters TX1 and TX2. The SM 1000 of FIG. 10A includes a first buck converter 1003 dedicated to the first LA 1001 which provides modulated supply voltage to the PA of the first transmitter TX1, a second buck converter 1005 dedicated to the second LA 1002 which provides modulated supply voltage to the PA of the second transmitter TX2, and a buck-boost converter 1004, which is shared between the two LAs 1001 and 1002. Therefore, the example embodiment of FIG. 10A decreases the used die area and reduces the number of external components by sharing a buck-boost converter 1004 between two transmitters TX1 and TX2, instead of having two separate buck-boost converters, each dedicated to one of the two transmitters TX1 and TX2. Additionally, the SM 1000 of FIG. 10A eliminates an external load capacitor by sharing the capacitor Cbk 1020 and capacitor Cbb 1026 between the two transmitter paths TX1 and TX2. The sharing of capacitors Cbb 1026 and Cbk 1020 are realized by the four APT switches of Sbb (e.g., Sbb1, Sbb2) and Sbk (e.g., Sbk1, Sbk2), respectively.

FIG. 10B illustrates a table 1050 describing the status (on/off) of the different components of the SM 1000 of FIG. 10A during different modes of operation of the SM 1000 and the outputs of the SM 1000 at the output terminals TXB, TXK, TX1, and TX2. The SM 1000 of FIG. 10A may have seventeen modes of operations. For example, when operating in an ET mode with only one of TX1 or TX2 output being active, as shown in the table of FIG. 10B for modes 7 and 8, the buck-boost converter 1004 may be on, however, only one of the first buck converter 1003 or the second buck converter 1005 may be on. As shown in the table of FIG. 10B, during the operating mode 7 (ET 1x TX), the buck-boost converter 1004 is on, the first buck converter 1003 is on, the first LA 1001 is on, however, the second buck converter 1005 is off and the second LA 1002 is off. During mode 7, the output at the output terminal TX1 of the first LA 1001 may be an envelope signal ET1 which may be used to track an envelope of the RF_out signal of a PA. As also shown in the table of FIG. 10B, during the operating mode 8 (ET 1x TX), the buck-boost converter 1004 is on, the second buck converter 1005 is on, the second LA 1002 is on, however, the first buck converter 1003 is off and the first LA 1001 is off. During mode 8, the output at the output terminal TX2 of the second LA 1002 may be an envelope signal ET2 which may be used to track an envelope of the RF_out signal of a PA.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a supply modulator for power amplifier have been specifically described and illustrated herein, many modifications and variations will be apparent to those skilled in the art. Accordingly, it is to be understood that a system and method relating to a supply modulator for power amplifier constructed according to principles of this invention may be embodied other than as specifically described herein. The invention is also defined in the following claims, and equivalents thereof.

What is claimed is:

1. An apparatus comprising:
   a buck-boost converter;
   a first buck converter connected at an output terminal of the buck-boost converter;
   a second buck converter connected at the output terminal of the buck-boost converter;
   a first linear amplifier (LA) comprising a first supply voltage input terminal connected to the output terminal of the buck-boost converter, and an output terminal connected to an output terminal of the first buck converter, wherein the first LA is configured to provide a first modulated supply voltage to a first power amplifier (PA) of a first transmitter via the output terminal of the first LA; and
   a second LA comprising a second supply voltage input terminal connected to the output terminal of the buck-boost converter, and an output terminal connected to an output terminal of the second buck converter, wherein the second LA is configured to provide a second modulated supply voltage to a second PA of a second transmitter via the output terminal of the second LA.

2. The apparatus of claim 1, further comprising:
   a first switch module comprising a first switch and a second switch; and
   a second switch module comprising a third switch and a fourth switch, wherein
      a first terminal of the first switch and a first terminal of the second switch are connected to the output terminal of the first buck converter,
      a first terminal of the third switch and a first terminal of the fourth switch are connected to the output terminal of the second buck converter,
      a second terminal of the first switch and a second terminal of the third switch are connected to the output terminal of the buck-boost converter, and
      a second terminal of the second switch and a second terminal of the fourth switch are connected to each other.

3. The apparatus of claim 1, wherein the buck-boost converter comprises:
   a first P-type or complementary metal oxide semiconductor (CMOS) transistor, a source terminal of the first P-type or CMOS transistor is connected to a battery voltage;
   a first N-type transistor, a drain terminal of the first N-type transistor is connected to a drain terminal of the first P-type or CMOS transistor and a source terminal of the first N-type transistor is connected to ground;
   a second P-type or CMOS transistor, a source terminal of the second P-type or CMOS transistor is connected to the output terminal of the buck-boost converter;
   a second N-type transistor, a drain terminal of the second N-type transistor is connected to a drain terminal of the second P-type or CMOS transistor and a source terminal of the second N-type transistor is connected to the ground; and
   a first inductor connected between the drain terminal of the first P-type or CMOS transistor and the drain terminal of the second P-type or CMOS transistor, wherein an inductance of the first inductor is between 0.1 µH to 10 µH, and a current carrying capability of the first inductor is greater than 1A.

4. The apparatus of claim 1, wherein the first buck converter comprises:
   a first P-type transistor, a source terminal of the first P-type transistor is connected to a battery voltage;
   a first N-type transistor, a drain terminal of the first N-type transistor is connected to a drain terminal of the first P-type transistor and a source terminal of the first N-type transistor is connected to a ground;
   a second P-type transistor, wherein a drain terminal of the second P-type transistor is connected to the drain terminal of the first P-type transistor and the drain terminal of the first N-type transistor, and a source terminal of the second P-type transistor is connected to the output terminal of the buck-boost converter; and
   a second inductor connected between the drain terminal of the second P-type transistor and the output terminal of the first buck converter, wherein an inductance of the second inductor is between 0.1 µH to 10 µH, and a current carrying capability of the second inductor is greater than 1A.

5. The apparatus of claim 1, wherein the second buck converter comprises:
   a first P-type transistor, a source terminal of the first P-type transistor is connected to a battery voltage;
   a first N-type transistor, a drain terminal of the first N-type transistor is connected to a drain terminal of the first P-type transistor and a source terminal of the first N-type transistor is connected to a ground;
   a second P-type transistor, wherein a drain terminal of the second P-type transistor is connected to the drain terminal of the first P-type transistor and the drain terminal of the first N-type transistor, and a source terminal of the second P-type transistor is connected to the output terminal of the buck-boost converter; and
   a third inductor connected between the drain terminal of the second P-type transistor and the output terminal of the second buck converter, wherein an inductance of the third inductor is between 0.1 µH to 10 µH, and a current carrying capability of the third inductor is greater than 1A.

6. The apparatus of claim 1, wherein the apparatus is configured to operate in an average power tracking (APT) mode or in an envelope tracking (ET) mode.

7. The apparatus of claim 2, wherein the first switch, the second switch, the third switch, and the fourth switch are p-channel metal oxide semiconductor (PMOS) transistors, or n-channel metal oxide semiconductor (NMOS) transistors, or complementary MOS (CMOS) transistors.

8. The apparatus of claim 2, further comprising:
   a first capacitor connected between the second terminal of the first switch or the second terminal of the third switch and ground, wherein the second terminal of the first switch and the second terminal of the third switch are connected together; and
   a second capacitor connected between the second terminal of the second switch or the second terminal of the fourth switch and the ground.

9. The apparatus of claim 8, wherein a capacitance for the first capacitor is between 0.1 µF to 10 µF and a capacitance of the second capacitor is between 0.1 uF to 10 uF.

10. A system comprising:
    a buck-boost converter;
    a first buck converter connected at an output terminal of the buck-boost converter;
    a second buck converter connected at the output terminal of the buck-boost converter; and
    a first linear amplifier (LA) comprising a first supply voltage input terminal connected to the output terminal of the buck-boost converter, and an output terminal connected to an output terminal of the first buck converter.

11. The system of claim 10, further comprising:
a second LA comprising a second supply voltage input terminal connected to the output terminal of the buck-boost converter, and an output terminal connected to an output terminal of the second buck converter.

12. The system of claim 11, wherein the first LA is configured to provide a first modulated supply voltage to a first power amplifier (PA) of a first transmitter via the output terminal of the first LA and the second LA is configured to provide a second modulated supply voltage to a second PA of a second transmitter via the output terminal of the second LA.

13. The system of claim 11, wherein the buck-boost converter comprises:
a first P-type or CMOS transistor, a source terminal of the first P-type or CMOS transistor is connected to a battery voltage;
a first N-type transistor, a drain terminal of the first N-type transistor is connected to a drain terminal of the first P-type or CMOS transistor and a source terminal of the first N-type transistor is connected to ground;
a second P-type or CMOS transistor, a source terminal of the second P-type or CMOS transistor is connected to the output terminal of the buck-boost converter;
a second N-type transistor, a drain terminal of the second N-type transistor is connected to a drain terminal of the second P-type or CMOS transistor and a source terminal of the second N-type transistor is connected to the ground; and
a first inductor connected between the drain terminal of the first P-type or CMOS transistor the drain terminal of the second P-type or CMOS transistor, wherein an inductance of the first inductor is between 0.1 µH to 10 µH, and a current carrying capability of the first inductor is greater than 1A.

14. The system of claim 11, wherein the first buck converter comprises:
a first P-type transistor, a source terminal of the first P-type transistor is connected to a battery voltage;
a first N-type transistor, a drain terminal of the first N-type transistor is connected to a drain terminal of the first P-type transistor and a source terminal of the first N-type transistor is connected to a ground;
a second P-type transistor, wherein a drain terminal of the second P-type transistor is connected to the drain terminal of the first P-type transistor and the drain terminal of the first N-type transistor, and a source terminal of the second P-type transistor is connected to the output terminal of the buck-boost converter; and
a second inductor connected between the drain terminal of the second P-type transistor and the output terminal of the first buck converter, wherein an inductance of the second inductor is between 0.1 µH to 10 µH, and a current carrying capability of the second inductor is greater than 1A.

15. The system of claim 11, wherein the second buck converter comprises:
a first P-type transistor, a source terminal of the first P-type transistor is connected to a battery voltage;
a first N-type transistor, a drain terminal of the first N-type transistor is connected to a drain terminal of the first P-type transistor and a source terminal of the first N-type transistor is connected to a ground;
a second P-type transistor, wherein a drain terminal of the second P-type transistor is connected to the drain terminal of the first P-type transistor and the drain terminal of the first N-type transistor, and a source terminal of the second P-type transistor is connected to the output terminal of the buck-boost converter; and
a third inductor connected between the drain terminal of the second P-type transistor and the output terminal of the second buck converter, wherein an inductance of the third inductor is between 0.1 µH to 10 µH, and a current carrying capability of the third inductor is greater than 1A.

16. The system of claim 12, further comprising:
a first switch module comprising a first switch and a second switch; and
a second switch module comprising a third switch and a fourth switch, wherein
a first terminal of the first switch and a first terminal of the second switch are connected to the output terminal of the first buck converter,
a first terminal of the third switch and a first terminal of the fourth switch are connected to the output terminal of the second buck converter,
a second terminal of the first switch and a second terminal of the third switch are connected to the output terminal of the buck-boost converter, and
a second terminal of the second switch and a second terminal of the fourth switch are connected to each other, wherein the first switch, the second switch, the third switch, and the fourth switch are p-channel metal oxide semiconductor (PMOS) transistors, or n-channel metal oxide semiconductor (NMOS) transistors, or complementary MOS (CMOS) transistors.

17. The system of claim 16, further comprising:
a first capacitor connected between the second terminal of the first switch or the second terminal of the third switch and ground, wherein the second terminal of the first switch and the second terminal of the third switch are connected together; and
a second capacitor connected between the second terminal of the second switch or the second terminal of the fourth switch and the ground, wherein a capacitance for the first capacitor is between 0.1 µF to 10 µF and a capacitance of the second capacitor is between 0.1 uF to 10 uF.

18. A method comprising:
receiving an input voltage at an input terminal of an apparatus from a battery source;
producing a first output voltage by modulating the input voltage to provide a first supply voltage to a first power amplifier in a first transmitter of an user equipment (UE); and
producing a second output voltage by modulating the input voltage to provide a second supply voltage to a second power amplifier in a second transmitter of the UE, wherein the first output voltage is produced at an output terminal of a first linear amplifier (LA) and the second output voltage is produced at an output terminal of a second LA, wherein each of the first LA and the second LA receives a supply voltage from an output terminal of a buck-boost converter.

19. The method of claim 18, wherein input voltage is modulated by stepping up or stepping down the input voltage to produce the first output voltage according to a desired value of the first supply voltage, and stepping up or stepping down the input voltage to produce the second output voltage according to a desired value of the second supply voltage, wherein the input voltage is modulated by using the buck-boost converter and at least two buck converters in the apparatus.

* * * * *